United States Patent
Nam et al.

(10) Patent No.: US 7,442,981 B2
(45) Date of Patent: Oct. 28, 2008

(54) CAPACITOR OF SEMICONDUCTOR DEVICE AND METHOD OF FABRICATING THE SAME

(75) Inventors: Gab-Jin Nam, Seoul (KR); Young-Sun Kim, Gyeonggi-do (KR); Cha-Young Yoo, Gyeonggi-do (KR); Jong-Cheol Lee, Seoul (KR); Jin-Tae Noh, Gyeonggi-do (KR); Jae-Young Ahn, Gyeonggi-do (KR); Young-Geun Park, Gyeonggi-do (KR); Jae-Hyoung Choi, Gyeonggi-do (KR); Jae-Hyun Yeo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 125 days.

(21) Appl. No.: 11/316,487

(22) Filed: Dec. 21, 2005

(65) Prior Publication Data
US 2006/0186452 A1     Aug. 24, 2006

(30) Foreign Application Priority Data
Jan. 29, 2005   (KR) .................... 10-2005-0008346

(51) Int. Cl.
*H01L 27/108*   (2006.01)
*H01L 29/94*    (2006.01)

(52) U.S. Cl. .............. 257/303; 257/308; 257/305; 257/306; 438/57; 438/622

(58) Field of Classification Search .............. 438/57, 438/622
See application file for complete search history.

(56) References Cited

U.S. PATENT DOCUMENTS

| | | | | |
|---|---|---|---|---|
| 6,150,706 | A  * | 11/2000 | Thakur et al. ............... | 257/532 |
| 6,191,443 | B1 * | 2/2001  | Al-Shareef et al. .......... | 257/310 |
| 6,696,717 | B2 * | 2/2004  | Chang et al. ................ | 257/301 |
| 2002/0123216 | A1 * | 9/2002 | Yokoyama et al. .......... | 438/622 |
| 2005/0037598 | A1 * | 2/2005 | Witvrouw ................... | 438/488 |

FOREIGN PATENT DOCUMENTS

KR   2003-0012733   2/2003

* cited by examiner

*Primary Examiner*—Zandra Smith
*Assistant Examiner*—Telly D Green
(74) *Attorney, Agent, or Firm*—Marger Johnson & McCollom, P.C.

(57) ABSTRACT

Provided is a capacitor of a semiconductor device and a method of fabricating the same. In one embodiment, the capacitor includes a lower electrode formed on a semiconductor substrate; a dielectric layer formed on the lower electrode; and an upper electrode that is formed on the dielectric layer. The upper electrode includes a first conductive layer, a second conductive layer, and a third conductive layer stacked sequentially. The first conductive layer comprises a metal layer, a conductive metal oxide layer, a conductive metal nitride layer, or a conductive metal oxynitride layer. The second conductive layer comprises a doped polysilicon germanium layer. The third conductive layer comprises a material having a lower resistance than that of the second conductive layer.

23 Claims, 6 Drawing Sheets

CAPACITOR OF SEMICONDUCTOR DEVICE AND METHOD OF FABRICATING THE SAME

CROSS-REFERENCE TO RELATED PATENT APPLICATIONS

This application claims the benefit of Korean Patent Application No. 10-2005-0008346, filed on Jan. 29, 2005, in the Korean Intellectual Property Office, the disclosure of which is incorporated herein in its entirety by reference.

BACKGROUND

1. Field of the Invention

The present invention relates to a capacitor of a semiconductor device and a method of fabricating the same, and more particularly, to a DRAM cell capacitor applicable to a highly integrated device and a method of fabricating the capacitor.

2. Description of the Related Art

As the degree of integration of semiconductor devices increases, the sizes of cells are reduced and the effective areas of lower electrodes in cell capacitors are also reduced in semiconductor devices such as DRAMs. However, in order to maintain stable operation of a semiconductor device, cell capacitance greater than a predetermined value must be sustained. In order to ensure high cell capacitance in a narrow area, a high-k dielectric layer formed of a material with a larger dielectric constant than a capacitor dielectric layer such as a silicon oxide layer, a silicon nitride layer, or a silicon nitride layer/silicon oxide layer is required. For example, a high-k dielectric layer such as a tantalum oxide layer ($Ta_2O_5$, dielectric constant: 20~60), a hafnium oxide layer ($HfO_2$, dielectric constant: ~20), a titanium oxide layer ($TiO_2$, dielectric constant: ~40), an aluminum oxide layer ($Al_2O_3$, dielectric constant: ~10), or a lanthanum oxide layer ($La_2O_3$, dielectric constant: ~40) can be used as the dielectric layer.

However, doped polysilicon, which is conventionally used for a capacitor's upper and lower electrodes, interacts with high-k dielectric layers, and thus degrades the electrical characteristics of the capacitor. In addition, since the doped polysilicon has a small work function, the barrier height formed between the high-k dielectric layer, which has a large work function, and the doped polysilicon dielectric layer is relatively low. If this barrier is not high enough, electrons tunnel between the upper and lower electrodes, thus increasing leakage current. In addition, when the doped polysilicon is used as the electrode, the doped polysilicon layer should be formed or heat-treated at a temperature of 600° C. or higher in order to activate the dopant of the doped polysilicon electrode. However, a high temperature process such as this may additionally result in a higher leakage current of the capacitor.

Instead of a conventional semiconductor-insulator-semiconductor (SIS) capacitor using the doped polysilicon electrode as the upper and lower electrodes, it has been suggested that a metal layer, having less reactivity than the polysilicon layer, be used as the upper electrode of a capacitor employing a high-k dielectric layer, or as both the upper and lower electrodes of such a capacitor. The former is called a metal-insulator-semiconductor (MIS) capacitor, and the latter is called a metal-insulator-metal (MIM) capacitor.

However, when the upper electrode is formed of only the metal layer, wet etching, dry etching, and stress related problems are generated during an integration process, and the metal layer cannot perform as a resistor layer for delaying signals since the layer has small resistivity. Therefore, a dual-layer, in which a doped polysilicon layer is stacked on a metal layer (e.g., a TiN layer), is used as the upper electrode. Here, the doped polysilicon layer is formed by depositing amorphous silicon using a low pressure chemical vapor deposition (LPCVD) method at a temperature of about 430-550° C., and then performing an activation heat treatment on the deposited amorphous silicon at a high temperature of 600° C. or higher for 30 minutes or longer. The resulting upper electrode may have a more appropriate resistance. In a semiconductor device, if the resistance of the upper electrode is large, the resistance may function as signal noise. However, due to the heat treatment of the doped polysilicon layer, the leakage current of the dual layer electrode may be higher than the leakage current of an electrode using only the metal layer.

Therefore, it is desirable to obtain an electrode material used in an upper electrode of a capacitor which is capable of performing with more optimal capacitance and device properties than the conventional dual-layer electrode that includes a doped polysilicon layer deposited on a TiN layer.

SUMMARY

The present invention provides a capacitor, and method of fabricating the capacitor, having good electrical characteristics and an upper electrode having an appropriate resistance.

According to one aspect of the present invention, a capacitor of a semiconductor device is provided. This capacitor includes a lower electrode formed on a semiconductor substrate, a dielectric layer formed on the lower electrode, and an upper electrode that is formed on the dielectric layer. The upper electrode further includes a first conductive layer, a second conductive layer, and a third conductive layer stacked sequentially. The first conductive layer may be a metal layer, a conductive metal oxide layer, a conductive metal nitride layer or a conductive metal oxynitride layer. The second conductive layer may be a doped polysilicon germanium layer. The third conductive layer may be formed of a material having a lower resistance than the second conductive layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
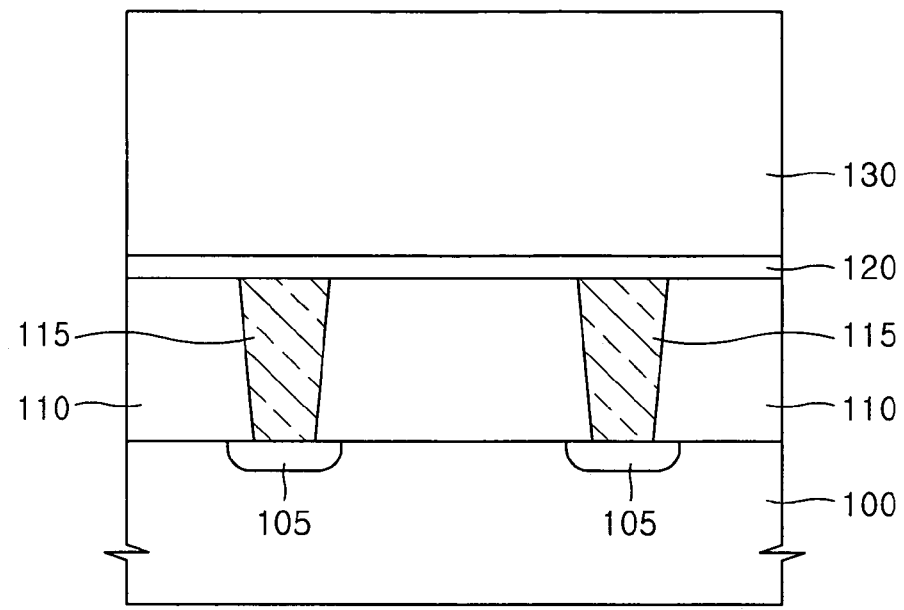
FIGS. 1 through 7 are cross-sectional views of a capacitor of a semiconductor device and a method of fabricating the capacitor according to a first embodiment of the present invention.

Hereinafter, the present invention will be described more fully with reference to the accompanying drawings in which embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity. To further facilitate understanding, identical reference numerals have been used, where possible, to designate identical elements.

FIGS. 1 through 7 are cross-sectional views illustrating a capacitor of a semiconductor device and a method of fabricating the capacitor according to a first embodiment of the present invention.

Figure 7:
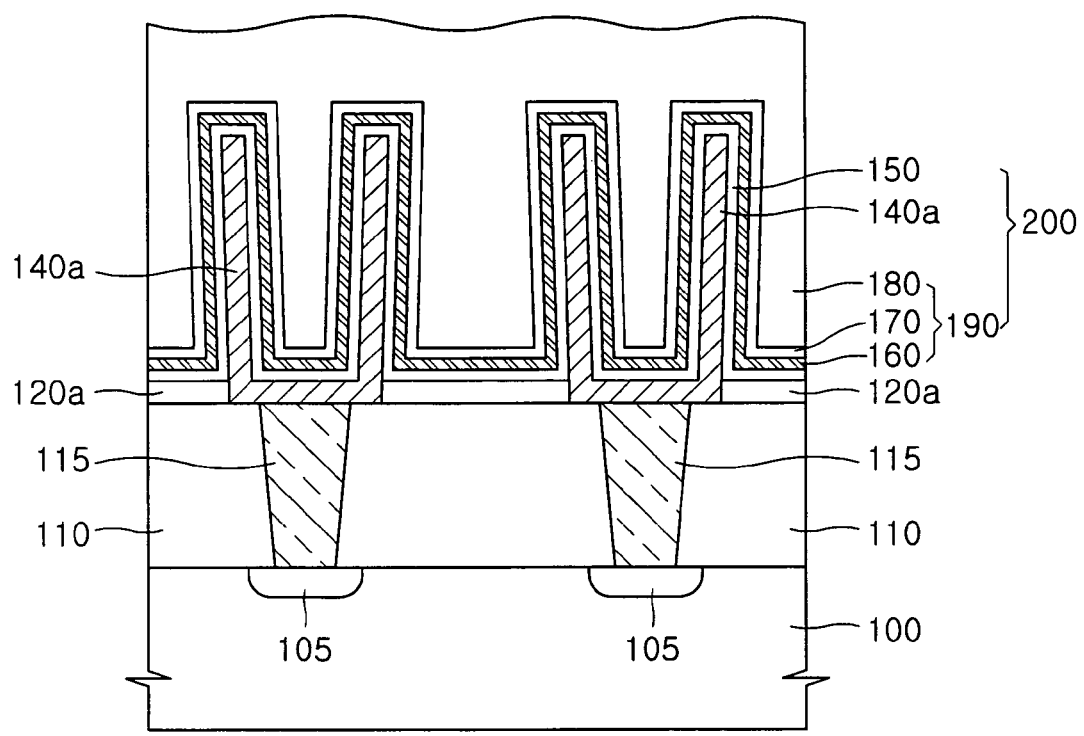

Referring to FIG. 7, the capacitor of the semiconductor device according to a first embodiment includes a capacitor lower electrode 140a formed on a semiconductor substrate 100, such as a silicon substrate, a dielectric layer 150 formed on the lower electrode 140a, and an upper electrode 190 formed on the dielectric layer 150. The lower electrode can have a three-dimensional structure in order to increase an effective area thereof. For example, the lower electrode 140a can be formed in a box structure, a one cylinder stack (OCS) structure, a stack structure, or a trench structure. In the present embodiment, the lower electrode 140a is formed in the OCS structure; however, other structures can be applied to the present invention also. The upper electrode includes a first conductive layer 160, a second conductive layer 170, and a third conductive layer 180 stacked sequentially. The first conductive layer 160 is one of a metal layer, a conductive metal oxide layer, a conductive metal nitride layer, and a conductive metal oxynitride layer. The second conductive layer 170 is a doped polysilicon germanium layer. The third conductive layer 180 is formed of a material having a lower resistance than the second conductive layer 170.

A method of fabricating the capacitor of the semiconductor device will now be described. Referring to FIG. 1, a lower insulating layer 110 is formed on the semiconductor substrate 100, and then, a plurality of contact plugs 115 penetrating through the lower insulating layer 110 to contact an impurity region 105 in the semiconductor substrate 100 are formed. An etch stop layer 120 such as a silicon nitride layer is formed on the contact plugs 115 and the lower insulating layer 110, and then a mold oxide layer 130 is formed by depositing boron phosphorous silicate glass (BPSG), phosphorous silicate glass (PSG), plasma enhanced (PE)-tetra ethyl ortho silicate (TEOS), or high density plasma (HDP) oxide on the etch stop layer 120.

Figure 2:
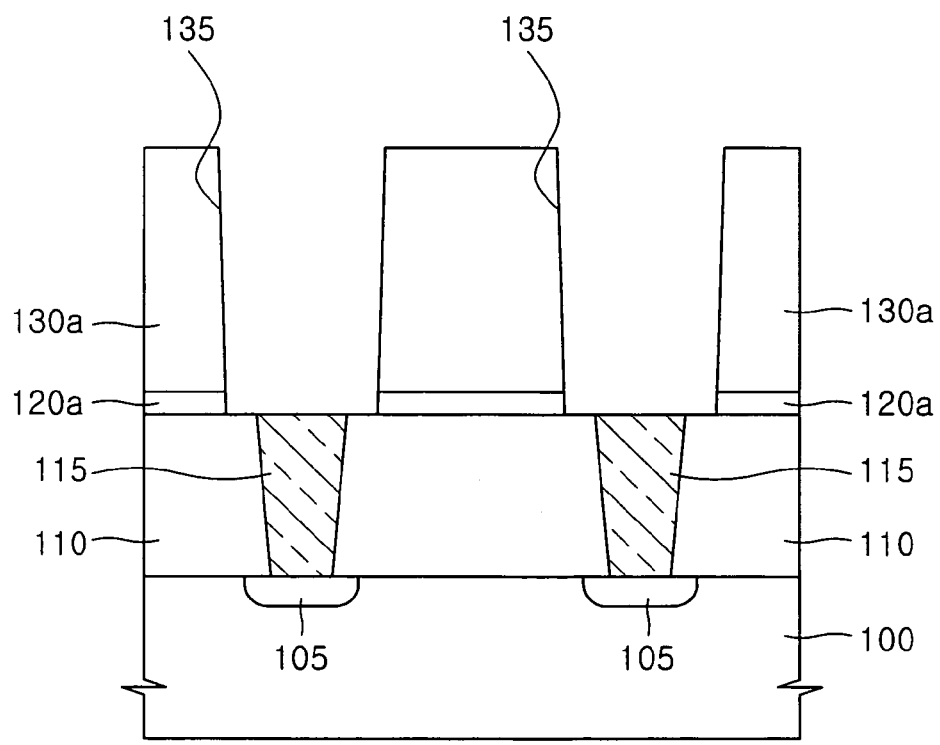

Referring to FIG. 2, the mold oxide layer 130 is etched until an upper surface of the etch stop layer 120 is exposed to form a mold oxide layer pattern 130a. Here, the etch stop layer 120 protects the lower insulating layer 110 from being etched. In addition, the exposed etch stop layer 120 is removed to form holes 135 exposing the contact plugs 115 and the upper surface of the lower insulating layer 110 around the contact plugs 115. Under the mold oxide layer pattern 130a, an etch stop layer pattern 120a remains.

A dual-layer including an anti-reflecting layer formed of a plasma enhanced CVD silicon oxynitride (PE-SiON) and a plasma enhanced CVD oxide (PE-OX) can be used as an etching mask (not shown) to etch the mold oxide layer 130. When the dual-layer is used, polymer remnants may be generated when the holes 135 are formed. Therefore, a process of pre-cleaning the semiconductor substrate 100 may further be performed in order to remove the polymer remnants. In the pre-cleaning process, a dilute hydrofluoric acid, a dilute sulfuric acid, or a dilute SC1 solution can be used to clean the substrate 100. The SC1 solution is a solution in which $NH_4OH$, $H_2O_2$, and deionized water ($H_2O$) are mixed in a ratio of about 1:4:20.

Figure 3:
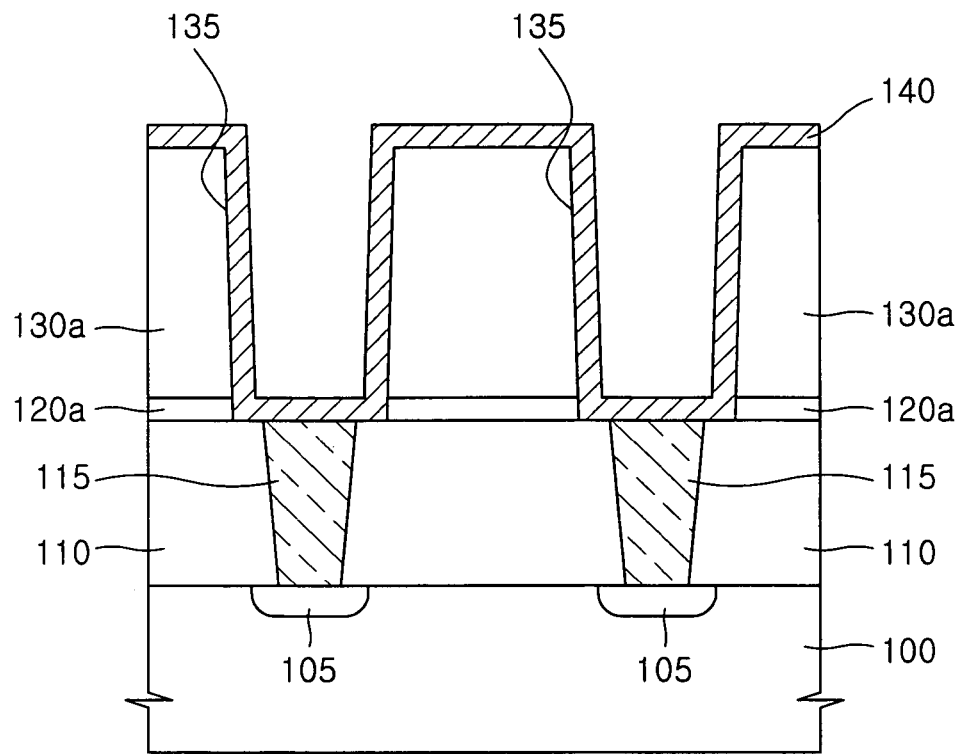

Referring to FIG. 3, a conductive layer 140 for the lower electrode is formed so as not to completely fill in the hole 135. A doped polysilicon can be deposited using a chemical vapor deposition (CVD) or an atomic layer deposition (ALD) method to form the conductive layer 140. For example, in order to ensure resistivity, polysilicon can be deposited using a general CVD method, and then $PH_3$ can be doped therein to form n-type doped polysilicon. Otherwise, doping can be performed in-situ with the deposition to form the n-type doped polysilicon. The lower electrode conductive layer 140 can be a metal layer having electrical conductivity, a metal oxide layer, a metal nitride layer, or a metal oxynitride layer instead of the doped polysilicon layer. For example, a metal such as W, Ru, Ir, Pt, Au, or Ag, a conductive metal oxide such as $RuO_2$, $IrO_2$, $SnO_2$, $In_2O_3$, $SnO_2$, $VO_3$, $CuO_3$, or $Cu_2O_3$, or a conductive metal nitride such as TiN can be used to form the conductive layer 140.

Figure 4:
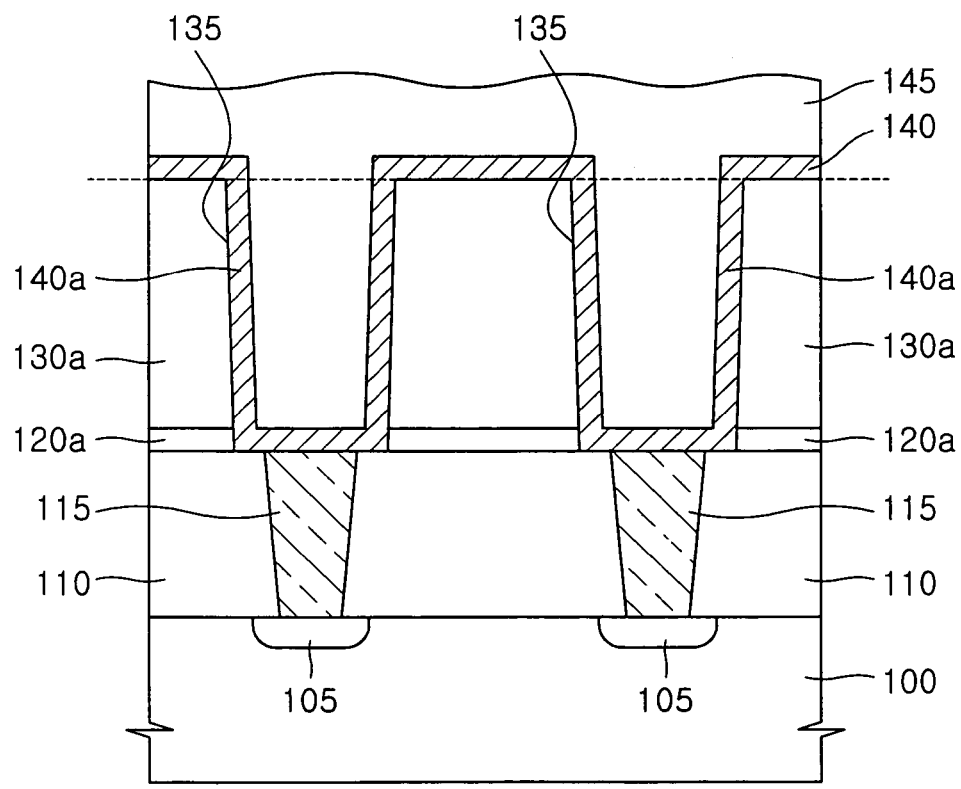

Referring to FIG. 4, a capping layer 145 having a good gap filling characteristic such as undoped silicate glass (USG) is deposited on the conductive layer 140 to fill the inside of the hole 135. The capping layer 145 and the conductive layer 140 are removed by an etch-back or chemical mechanical polishing (CMP) method until the upper surface of the mold oxide pattern 130a is exposed (i.e., the portion over the dotted line in FIG. 4 is removed). This forms the cylinder type lower electrodes 140a, which are separated from each other.

Figure 5:
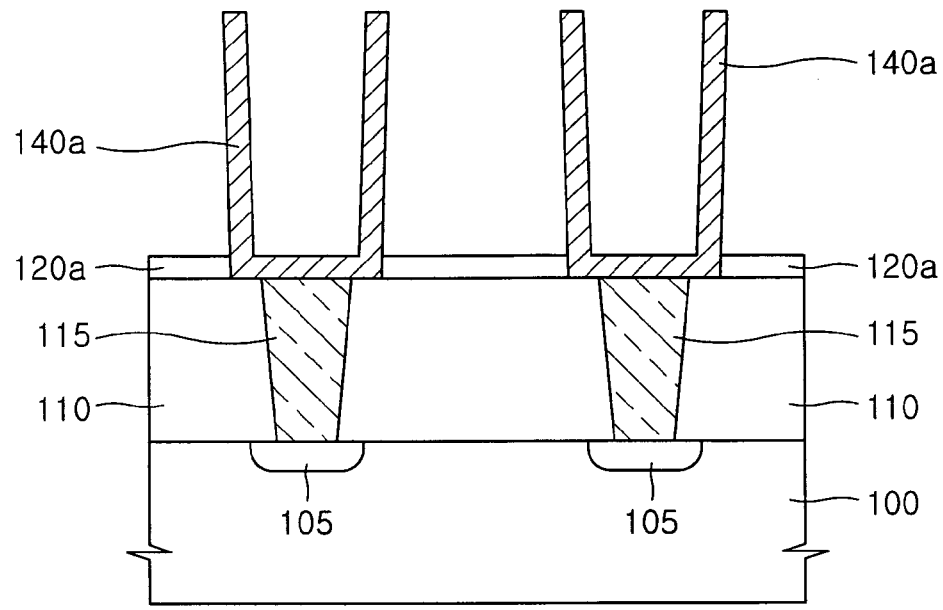

Next, referring to FIG. 5, the capping layer 145 and the mold oxide pattern 130a are removed by wet etching to expose the surface of the lower electrode 140a.

In addition, a pre-processing is performed in order to prevent a dielectric layer formed on the lower electrode 140a from reacting with the lower electrode 140a or diffusing into the lower electrode 140a. When doped polysilicon is used to form the lower electrode 140a, the pre-processing is performed using a rapid thermal process (RTP) such as rapid thermal nitridation (RTN) or rapid thermal oxidation (RTO), or a combination of these two methods. In the RTN method, $NH_3$, $N_2$, or a mixture of these two can be used as the nitridation gas. In the RTO method, $O_2$, $N_2O$, or a mixture of these two can be used as the oxidation gas. In addition, instead of using the RTP, a silicon oxide layer, a silicon nitride layer, or a silicon oxynitride layer can be formed to a small thickness (e.g., 10-40 Å) on the lower electrode 140a using the CVD or ALD method. A layer (not shown) formed using the pre-processing such as the RTP or the deposition prevents the lower electrode 140a and the dielectric layer from reacting with each other or diffusing into each other, thus preventing the dielectric layer from being degraded. Further, the above layer formed using the pre-processing also distributes an electric field that is directly applied to the dielectric layer when the device operates, thus reducing the leakage current.

Figure 6:
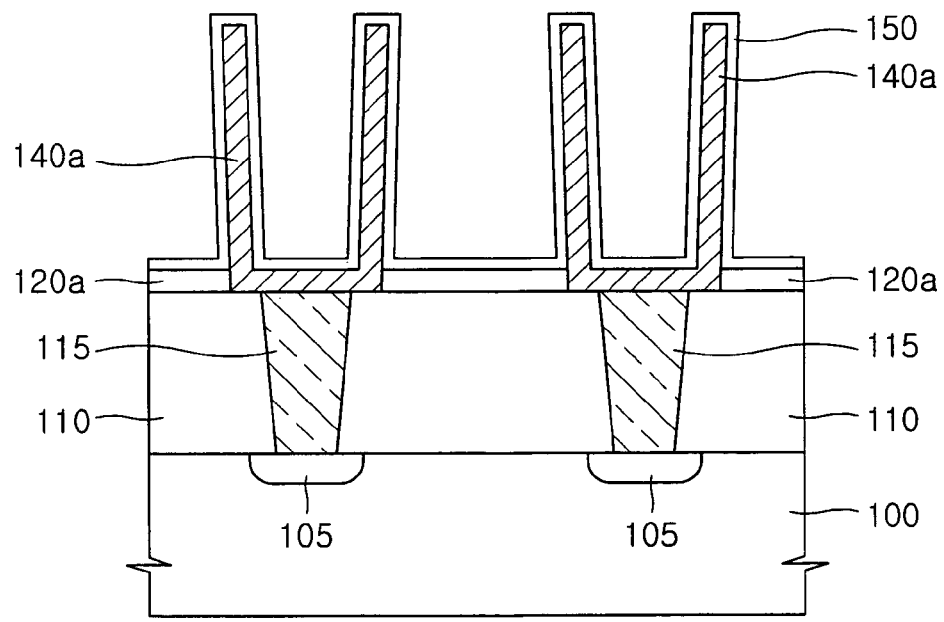

Referring to FIG. 6, the dielectric layer 150 is formed on the lower electrode 140a. A high-k dielectric layer formed of $Ta_2O_5$, $HfO_2$, $TiO_2$, $Al_2O_3$, $La_2O_3$, or combinations thereof can be used as the dielectric layer 150. The process of forming the dielectric layer 150 using the high-k dielectric layer can be performed using a deposition method at a temperature of about 150° C.-500° C. The dielectric layer 150 can be formed using CVD, physical vapor deposition (PVD), or ALD, and the CVD or ALD method can be used to form the dielectric layer in a capacitor having a lower electrode with a complex structure, such as a three-dimensional structure. In order to perform the deposition using CVD or ALD, a precursor and an oxidizer are required. A chloride-based material such as a metal halide and an organic metal source, such as a metal alkoxide and a metal 3-diketonate, can be used as the precursor for depositing the high-k dielectric layer. In addition, oxygen, ozone, or $H_2O$ can be used as the oxidizer. In CVD, the precursor and the oxidizer are injected separately into a reactor and react with each other on a heated wafer, resulting in the deposit of a thin film. In order to lower an activation energy of the reaction, plasma or light of a certain wavelength can be used as an energy source. The reaction pressure can be within the range of about 100 mtorr to about 760 torr. In ALD, the precursor and the oxidizer are separately supplied onto a wafer while purging the wafer using an inert gas when supplying the precursor and the oxidizer. For example, after supplying the precursor into a reactor, the reactor can be purged using the inert gas. This results in part of the precursor remaining as an atomic monolayer on the wafer, while the rest of the precursor is discharged out of the reactor. After that, the oxidizer is supplied into the reactor, which reacts with the precursor on the surface of the wafer to form the thin high-k oxide layer. In addition, the inert gas is used to purge excess oxidizer from the reactor. As described above, the series of operations of supplying a precursor, purging, supplying an oxidizer, and purging are included in a single cycle of ALD. The desired thickness of deposition can further be obtained by controlling the number of ALD cycles. When ALD is used, the film quality is superior to that obtained using the CVD, a high step-coverage can be ensured in the three-dimensional structure, and the thickness of the thin dielectric layer is relatively easy to control. Thus, the ALD method is often considered superior to the CVD method. However, the CVD method is advantageous in view of mass production.

Next, the dielectric layer 150 is heat-treated. Because the dielectric layer 150 as deposited is not dense due to lack of oxygen, it may be weak against leakage current. Therefore, the deposited dielectric layer 150 is heat-treated under an oxygen atmosphere to compensate for the oxygen shortage. Heat, $O_3$, $O_2$, plasma, or $UV-O_3$ can be used as the energy source in the heat treatment, and the heat treatment atmosphere can be created using $O_2$, $O_3$, or $N_2O$.

The dielectric layer 150 of the capacitor can be deposited to a desired thickness at one time or the deposition can be separately performed a plurality of times in order to improve the electrical characteristics of the dielectric layer 150. Therefore, the deposition and heat treatment can be performed repeatedly.

Referring to FIG. 7, the upper electrode 190 is formed on the dielectric layer 150 to complete the capacitor 200. The upper electrode 190 is formed by sequentially stacking a first conductive layer 160, a second conductive layer 170, and a third conductive layer 180. Preferably, the first, second, and third conductive layers 160, 170, and 180 may form a TiN/doped polysilicon germanium/W or tungsten silicide ($WSi_x$) structure.

The first conductive layer 160 can be formed of a metal, a conductive metal oxide layer, a conductive metal nitride, or a conductive metal oxynitride. Such a layer will react little with the dielectric layer 150, and thus minimize degradation of the dielectric layer 150 while increasing the height of the barrier between the dielectric layer 150 and the upper electrode 190. In particular, the first conductive layer 160 can be formed of TiN, WN, TaN, Ru, or RuOx. In addition, the first conductive layer 160 can be formed using CVD, ALD, or metal organic CVD (MOCVD). The deposition temperature of the first conductive layer 160 may be within a range from about 450° C. to about 500° C.

The second conductive layer 170 is formed of doped polysilicon germanium. The polysilicon germanium layer is formed using a silane-based gas, such as $SiH_4$, $Si_2H_6$, $SiH_2Cl_2$, $GeH_4$, or $GeF_4$ at a temperature within a range from about 400° C. to about 520° C. The second conductive layer 170 may initially be formed amorphously and polycrystallized in an activation heat treatment process, or may be formed in a polycrystalline form and activated initially. When the second conductive layer 170 is formed to be amorphous, the deposition temperature can be under about 400° C., for example, from about 350° C. to about 400° C., and the temperature of the activation heat treatment can be at a range from about 400° C. to about 520° C.

When an n-type doped polysilicon germanium layer is formed, P is doped in-situ while depositing the polysilicon germanium layer. When a p-type polysilicon germanium layer is formed, B is doped. A B doping source may be $BCl_3$ or $B_2H_6$. Instead of using the in-situ method, the impurities can be doped after depositing the polysilicon germanium layer. If the deposition temperature is lower than about 400° C., the doped impurities are activated through a heat treatment. However, the heat treatment temperature does not need to exceed about 500° C. like it does in the conventional art. Therefore, the capacitor 200 including the lower electrode 140a, the dielectric layer 150, and the upper electrode 190 can be fabricated at a relatively low temperature compared to a conventional capacitor, that is, under the temperature of about 520° C.

Since the silicon germanium has a lower melting point than silicon, physical phenomena such as the deposition, crystallization, grain growth, and the impurity activation can be performed at lower temperatures than for silicon. In the present embodiment, the doped polysilicon germanium is used in the upper electrode instead of using conventional doped polysilicon, resulting in process temperatures of about 520° C. or lower. This in turn can greatly improve the leakage current characteristics of the MIS or MIM capacitor.

The third conductive layer 180 is formed of a material having lower resistance than that of the doped polysilicon germanium of the second conductive layer 170. For example, WSix, W, WN, TaN, Ru, or RuOx can be used to form the third conductive layer 180. When using W, the third conductive layer 180 can be formed using LPCVD and using $WF_6$ as the source gas. In addition, the temperature range can be within about 400 to about 500° C. In the semiconductor device, the distribution of the resistance in the upper electrode 170 is very important, because a large resistance of the upper electrode 190 may produce noise. Therefore, if a material having lower resistance is formed on the uppermost part of the upper electrode 190, the appropriate resistance can be obtained.

As described above, the first conductive layer 160 is formed to prevent the dielectric layer 150 from being degraded and to increase the height of the barrier between the dielectric layer 150 and the upper electrode 190. The second conductive layer 170 is next formed of the doped polysilicon germanium layer at a low temperature to reduce the leakage current, thus improving the electrical characteristics of the capacitor 200. In addition, the third conductive layer 180 having a lower resistance than the second conductive layer 170 is formed on the second conductive layer 170 to improve the resistance of the upper electrode 190.

Figure 8:
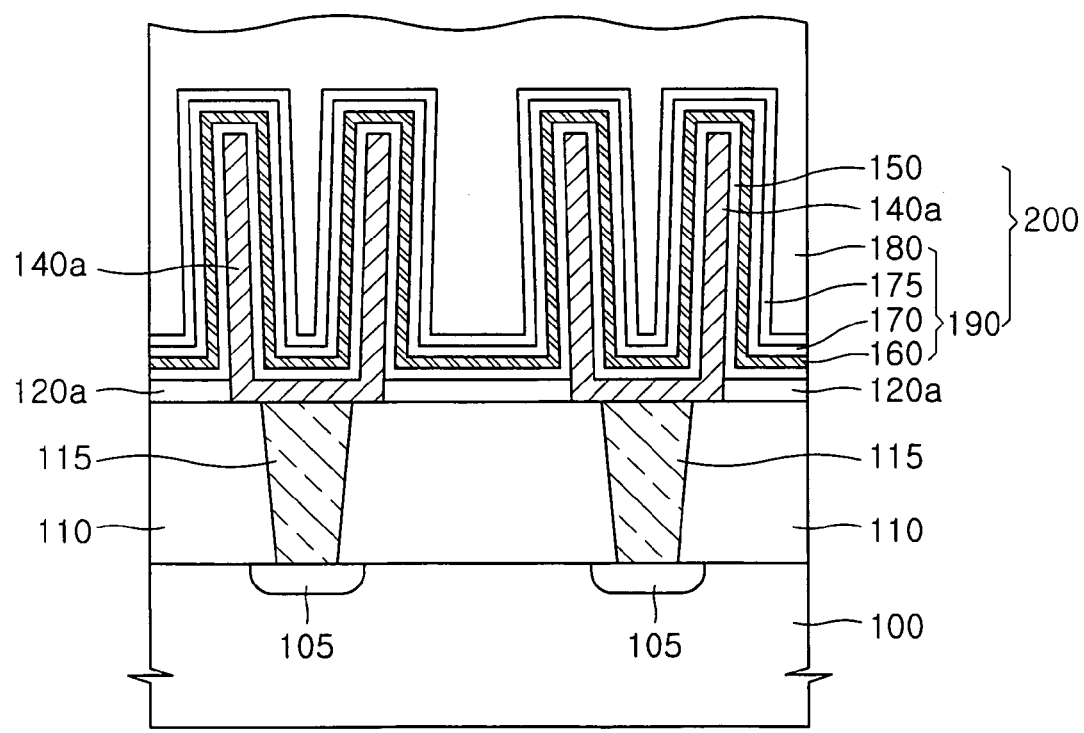
FIG. 8 is a cross-sectional view of a capacitor of a semiconductor device according to a second embodiment of the present invention.

FIG. 8 is a cross-sectional view of a capacitor of a semiconductor device according to a second embodiment of the present invention. In FIG. 8, the same reference numerals as those of FIGS. 1 through 7 denote the same elements and detailed descriptions for those elements will not be repeated.

Referring to FIG. 8, a barrier layer 175 is further formed between the second conductive layer 170 and the third conductive layer 180. The barrier layer 175 is formed of TiN or Ti/TiN. The barrier layer 175 prevents a reaction from occurring between the second conductive layer 170 and the third conductive layer 180.

EXPERIMENTAL EXAMPLES

The present invention will now be described in detail through the following experimental examples, with reference to FIGS. 9-12. The contents that are not described herein can be technically construed by those who skilled in the art, and thus detailed descriptions will be omitted. The following experimental examples are not intended to limit the scope of the present invention.

Experimental Example 1

Figure 9:
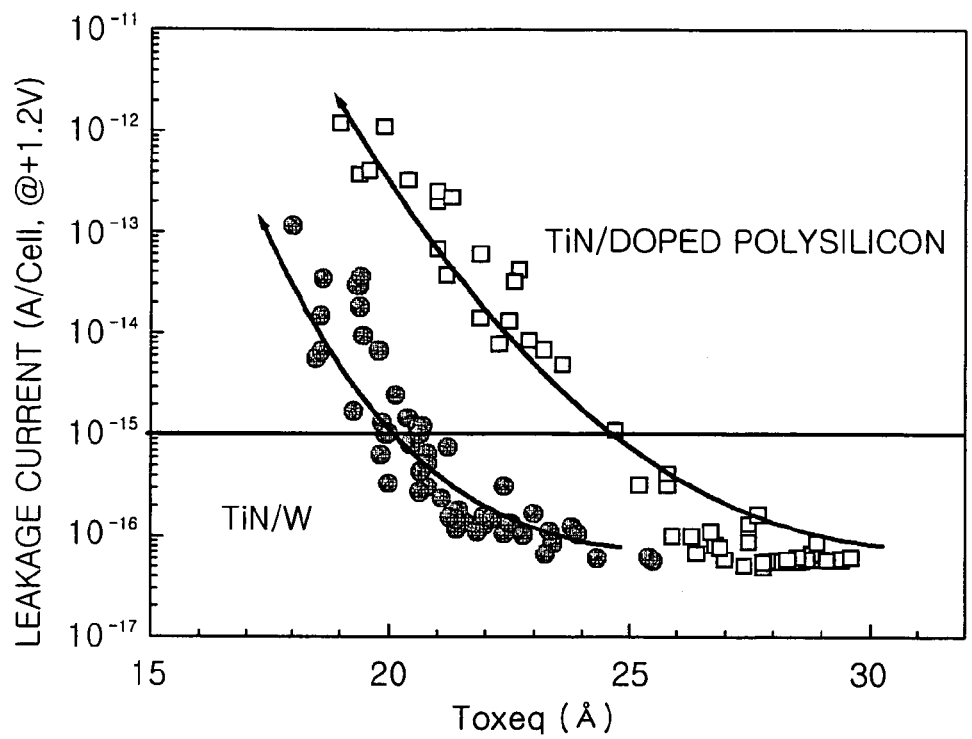
FIG. 9 is a graph illustrating electrical properties of a capacitor when TiN/doped polysilicon is used as an upper electrode (conventional electrode) and when TiN/W is used as the upper electrode (an electrode included in the present invention)

FIG. 9 illustrates electrical characteristics of a capacitor when TiN/doped polysilicon is used as the upper electrode (conventional electrode) and when TiN/W is used as the upper electrode (an electrode included in the present invention). Referring to FIG. 9, when the TiN/W electrode is used as the upper electrode, Toxeq can be reduced by about 5 Å for a given leakage current. In addition, when a TiN/SiGe electrode is used as the upper electrode, the capacitor shows similar characteristics to the capacitor including the TiN/W electrode.

Experimental Example 2

As described above, the distribution of the resistance in the upper electrode is very important in a semiconductor device since a large resistance in the upper electrode may function as noise in signals.

Figure 10:
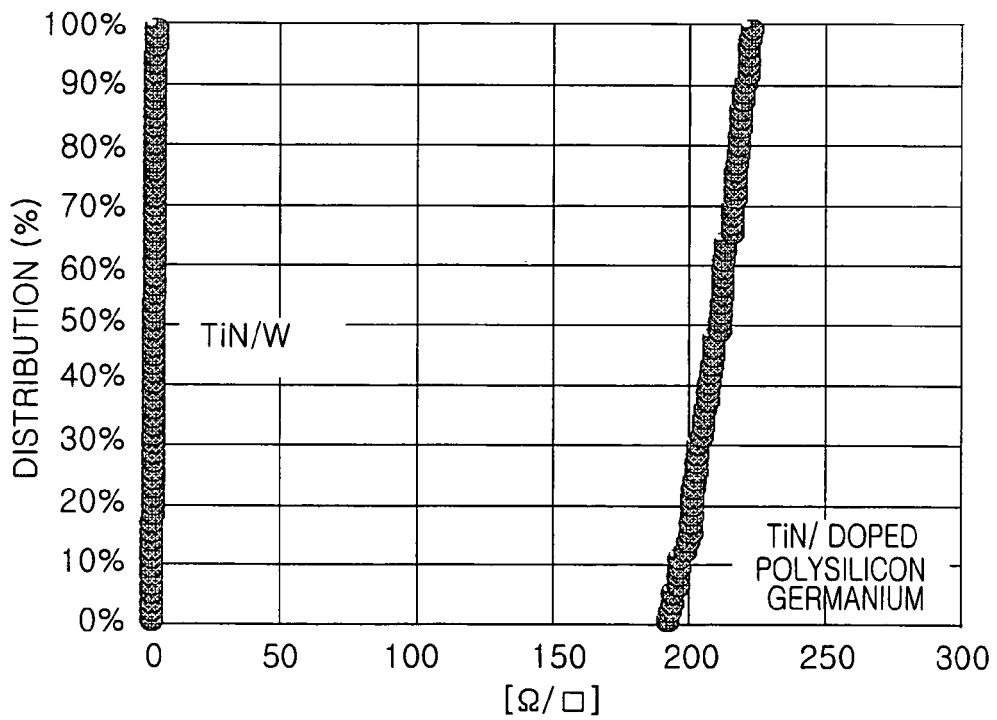
FIG. 10 is a graph illustrating resistances according to whether TiN/doped polysilicon or TiN/W is used as the material forming an upper electrode.

FIG. 10 is a graph illustrating resistances when various materials compose the upper electrode. The resistance was measured at 100 points on the upper electrode of each of the capacitor having the TiN/doped polysilicon germanium electrode as the upper electrode, and the capacitor having the TiN/W electrode as the upper electrode. In the graph of FIG. 10, the x-axis denotes the sheet resistance, and the y-axis denotes the percentage of the accumulated number of measuring points. Referring to FIG. 10, because lower sheet resistance of the upper electrode reduces leakage current, it is desirable that the TiN/W electrode is used as the upper electrode rather than the TiN/doped polysilicon germanium electrode.

However, in semiconductor devices, D0 failure is also an important element in addition to the electrical characteristics of the capacitor such as Toxeq and leakage current. A D0 failure is generated when the dielectric layer has a locally weak portion. Because D0 failure can affect the characteristics of a capacitor, it is an important element to track alongside Toxeq and leakage current.

Figure 11:
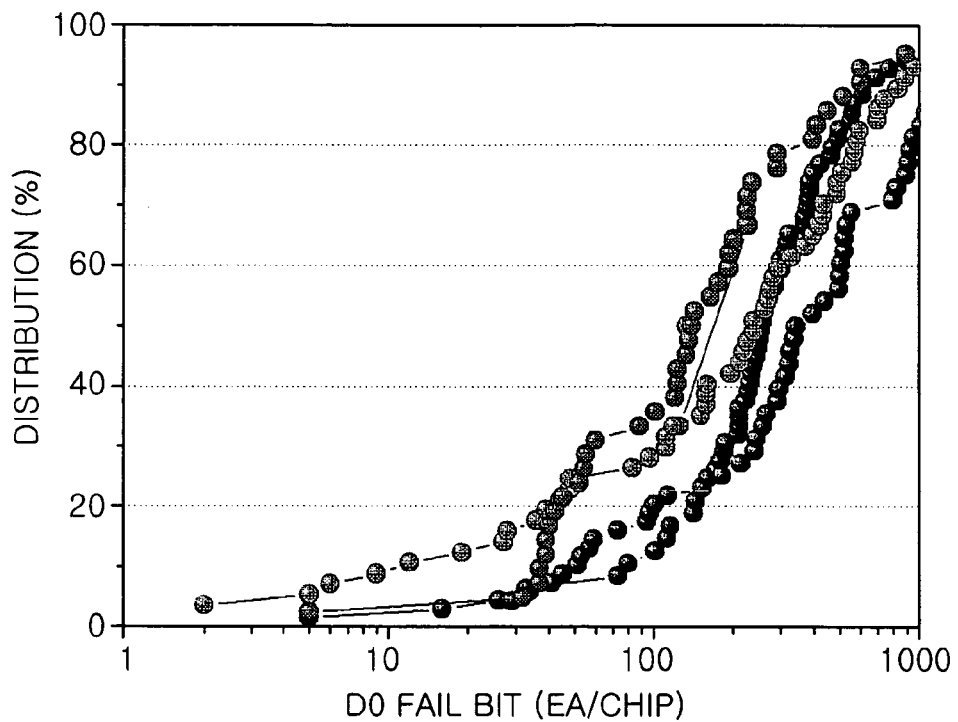
FIG. 11 is a graph illustrating a D0 failure distribution when TiN/W is used to form an upper electrode.
Figure 12:
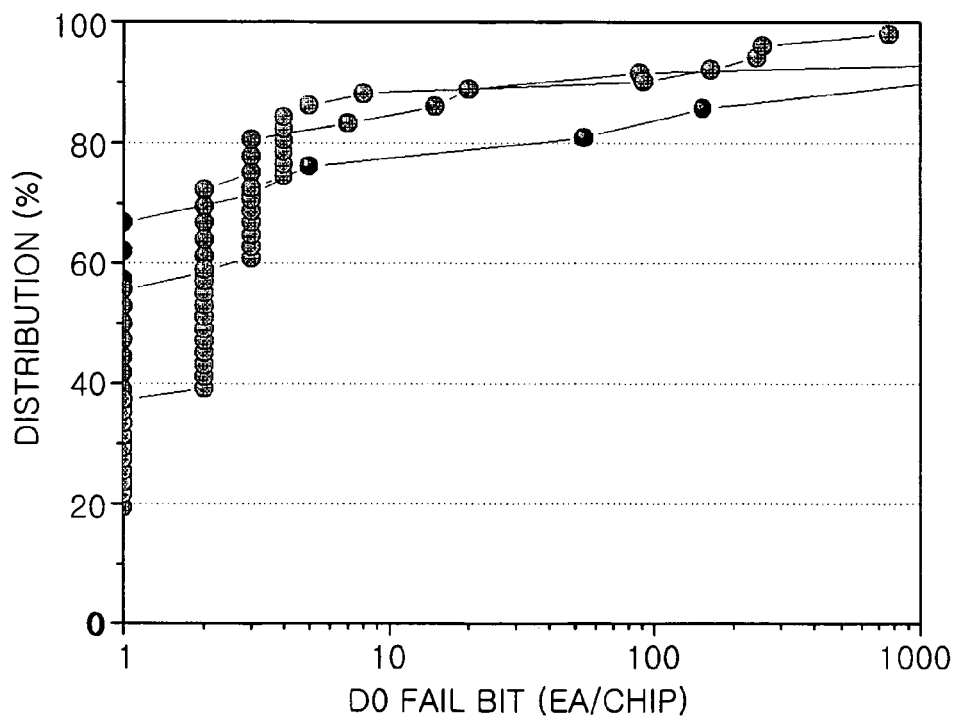
FIG. 12 is a graph illustrating a D0 failure distribution when TiN/doped polysilicon germanium is used to form an upper electrode.

FIG. 11 is a graph illustrating a distribution of D0 failures when a high-k dielectric layer such as $Al_2O_3/HfO_2$ is used as the dielectric layer of the capacitor and when the TiN/W layer is used as the upper electrode. FIG. 12 is a graph illustrating a distribution of D0 failures when the TiN/doped polysilicon germanium layer is used as the upper electrode. Referring to FIGS. 11 and 12, although the Toxeqs and the leakage currents are the same as each other, there is a large difference in the distribution of the D0 failures. Therefore, in consideration of the electric characteristics of the capacitor, it is desirable that TiN/doped polysilicon germanium is used as the upper electrode. When W is used as the upper electrode, the upper electrode may be degraded due to stress on the W layer or due to $WF_6$ used when the W layer is deposited.

Therefore, according to an aspect of the present invention, after forming the capacitor dielectric layer, the TiN electrode and the doped polysilicon germanium electrode are formed to improve the electrical characteristics of the capacitor. Then, WSix or W having a low resistance is deposited on the doped polysilicon germanium to improve the resistance of the upper electrode. That is, if the upper electrode includes first, second, and third conductive layers (the first conductive layer being a metal layer, a conductive metal oxide layer, a conductive metal nitride layer, or a conductive metal oxynitride layer; the second conductive layer being a doped polysilicon germanium layer; and the third conductive layer being formed of a material having lower resistance than the second conductive layer), with, for example, a TiN/doped polysilicon germanium/W structure, the electrical characteristics of the capacitor can be improved and the resistance distribution of the upper electrode can be improved.

Thus, according to some embodiments of the present invention, a capacitor can have improved electrical characteristics and reduced upper electrode resistance compared to conventional capacitors. Since the capacitor of the present invention has reduced leakage current and a lower resistance than a conventional capacitor, the capacitor can be formed smaller than a conventional capacitor.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A capacitor of a semiconductor device, the capacitor comprising:
   a lower electrode formed on a semiconductor substrate;
   a dielectric layer formed on the lower electrode; and
   an upper electrode that is formed on the dielectric layer, the upper electrode including a first conductive layer, a second conductive layer, and a third conductive layer, which are sequentially stacked,
   wherein the first conductive layer comprises a metal layer, a conductive metal oxide layer, a conductive metal nitride layer or a conductive metal oxynitride layer; the second conductive layer comprises a doped polysilicon germanium layer; and the third conductive layer comprises a material having a lower resistance than that of the second conductive layer.

2. The capacitor of claim 1, wherein the lower electrode comprises a doped polysilicon layer, a metal layer, a conductive metal oxide layer, a conductive metal nitride layer, or a conductive metal oxynitride layer.

3. The capacitor of claim 1, further comprising a silicon oxide layer, a silicon nitride layer, or a silicon oxynitride layer between the lower electrode and the dielectric layer.

4. The capacitor of claim 1, wherein the first conductive layer comprises TiN, WN, TaN, Ru, or RuOx.

5. The capacitor of claim 1, wherein the second conductive layer comprises P-doped polysilicon germanium.

6. The capacitor of claim 1, wherein the second conductive layer comprises B-doped silicon germanium.

7. The capacitor of claim 1, wherein the third conductive layer comprises WSix, W, WN, TaN, Ru, or RuOx.

8. The capacitor of claim 1, wherein the upper electrode further comprises a TiN layer or a Ti/TiN layer interposed between the second conductive layer and the third conductive layer.

9. A method of fabricating a capacitor of a semiconductor device, the method comprising:
   forming a lower electrode on a semiconductor substrate;
   forming a dielectric layer on the lower electrode; and
   forming an upper electrode by sequentially stacking a first conductive layer, a second conductive layer, and a third conductive layer on the dielectric layer,
   wherein the first conductive layer comprises a metal layer, a conductive metal oxide layer, a conductive metal nitride layer, or a conductive metal oxynitride layer; the second conductive layer comprises a doped polysilicon germanium layer; and the third conductive layer comprises a material having a lower resistance than that of the second conductive layer.

10. The method of claim 9, further comprising pre-cleaning the semiconductor substrate before forming the lower electrode.

11. The method of claim 10, wherein the pre-cleaning of the semiconductor substrate is performed using a dilute hydrofluoric acid, a dilute sulfuric acid, or a dilute SC1 solution.

12. The method of claim 9, wherein the lower electrode comprises a doped polysilicon layer, a metal layer, a conductive metal oxide layer, a conductive metal nitride layer, or a conductive metal oxynitride layer.

13. The method of claim 9, further comprising pre-processing the lower electrode after forming the lower electrode and before forming the dielectric layer.

14. The method of claim 13, wherein the pre-processing comprises performing a rapid thermal process.

15. The method of claim 11, wherein the pre-processing comprises forming a silicon oxide layer, a silicon nitride layer, or a silicon oxided nitride layer on the lower electrode using a chemical vapor deposition or atomic layer deposition.

16. The method of claim 9, wherein the forming of the dielectric layer comprises performing a deposition method at a temperature from about 150 to about 500° C.

17. The method of claim 9, wherein the first conductive layer comprises TiN, WN, TaN, Ru, or RuOx.

18. The method of claim 9, wherein the second conductive layer comprises P-doped polysilicon germanium.

19. The method of claim 9, wherein the second conductive layer comprises B-doped silicon germanium.

20. The method of claim 9, wherein the third conductive layer comprises WSix, W, WN, TaN, Ru, or RuOx.

21. The method of claim 9, further comprising forming a TiN layer or a Ti/TiN layer between the second conductive layer and the third conductive layer.

22. The capacitor of claim 1, wherein the second conductive layer is disposed over the first conductive layer and the third conductive layer is disposed over the second conductive layer.

23. The capacitor of claim 1, wherein the first conductive layer contacts the dielectric layer.

* * * * *

UNITED STATES PATENT AND TRADEMARK OFFICE
CERTIFICATE OF CORRECTION

| | | |
|---|---|---|
| PATENT NO. | : 7,442,981 B2 | Page 1 of 1 |
| APPLICATION NO. | : 11/316487 | |
| DATED | : October 28, 2008 | |
| INVENTOR(S) | : Gab-Jin Nam et al. | |

It is certified that error appears in the above-identified patent and that said Letters Patent is hereby corrected as shown below:

Column 5, line 6, the word "3-diketonate" should read -- β-diketonate --.

Signed and Sealed this

Twenty-fourth Day of February, 2009

JOHN DOLL
*Acting Director of the United States Patent and Trademark Office*